United States Patent
Pihlstrom et al.

(10) Patent No.: US 6,819,178 B2
(45) Date of Patent: Nov. 16, 2004

(54) SELECTABLE SINGLE MODE OR DIFFERENTIAL MODE OPERATION IN A SINGLE AMPLIFIER

(75) Inventors: Bert G. Pihlstrom, Fort Collins, CO (US); Ronnie E. Owens, Fort Collins, CO (US); Barbara J. Duffner, Fort Collins, CO (US); Michael Richter, Gaertrigen (DE); Ulrich Knoch, Boeblingen (DE)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/670,546

(22) Filed: Sep. 25, 2003

(65) Prior Publication Data

US 2004/0070451 A1 Apr. 15, 2004

Related U.S. Application Data

(62) Division of application No. 10/267,434, filed on Oct. 9, 2002, now Pat. No. 6,664,851.

(51) Int. Cl.$^7$ ................................................. H03F 3/45
(52) U.S. Cl. ........................................ 330/253; 330/51
(58) Field of Search .......................... 330/253, 51, 129, 330/261; 327/359

(56) References Cited

U.S. PATENT DOCUMENTS

| | | | |
|---|---|---|---|
| 4,720,686 A | | 1/1988 | Westwick |
| 5,942,942 A | | 8/1999 | Wang |
| 6,011,436 A | * | 1/2000 | Koike ......................... 330/253 |
| 6,121,836 A | | 9/2000 | Vallencourt |
| 6,137,314 A | | 10/2000 | Buck |
| 6,400,225 B1 | * | 6/2002 | Kruiskamp .................. 330/253 |
| 6,480,065 B1 | * | 11/2002 | Herrera et al. .............. 330/253 |

* cited by examiner

Primary Examiner—Henry Choe

(57) ABSTRACT

A dual mode amplifier having single ended and differential ended modes of operation using only one set of output pads or terminals. The dual mode amplifier has two differential amplifiers, connected by coupling circuitry, each differential amplifier receiving a pair of differential input signals and having one output terminal. By activating and deactivating the coupling circuitry, the differential amplifiers can operate in two modes using the one set of output terminals. In the singled ended mode, the differential amplifiers operate independently, each converting the differential input signals to a singled ended output signal at their respective output terminals. In the differential mode, the differential amplifiers operate together to provide a pair of differential output signals at the output terminals based upon the pair of input signals.

13 Claims, 4 Drawing Sheets

US 6,819,178 B2

SELECTABLE SINGLE MODE OR DIFFERENTIAL MODE OPERATION IN A SINGLE AMPLIFIER

The present application is a division of U.S. patent application Ser. No. 10/267,434, filed Oct. 9, 2002 now U.S. Pat. No. 6,664,851.

FIELD OF THE INVENTION

The present invention relates to an amplifier using common output terminals for dual modes of operation.

BACKGROUND OF THE INVENTION

Certain integrated circuit (IC) chips have the ability to internally generate differential signals that are driven off chip. These differential signals take the form of the original differential signal or can be converted to a single ended signal. In order to provide the capability of either output, the IC chips use parallel output paths. One path drives the signal through a differential amplifier, maintaining the original form of the signal. The other path is used to transmit the differential pair to be driven off chip to an amplifier that converts it to a single ended signal. For configurations consisting of two differential signals, four pads on the IC chip are required, one pair of pads for the differential signal mode (both differential signals are identical) and two pads for the signals in the single ended mode. If the IC is required to function only in one mode at any given time, use of four pads can increase the complexity of the IC chip by consuming additional space for redundant pads that could otherwise be used for pads providing other output signals.

Accordingly, a need exists for a dual mode amplifier having a simplified output configuration.

SUMMARY OF THE INTENTION

A second amplifier having dual modes of operation also includes two differential amplifiers each receiving a pair of differential input signals and having an output terminal. The second amplifier includes coupling circuits, controlled by a control signal, for coupling together corresponding differential input signals. A first value of the control signal activates the coupling circuits so that the differential amplifiers provide a differential signal at the output terminals in response to the differential input signals. A second value of the control signal deactivates the coupling circuits so that the differential amplifiers operate independently to provide a pair of single ended signals at the output terminals in response to two differential input signals.

These exemplary first and second amplifiers can also be used to implement a method for providing dual modes of operation in an amplifier using only one set of output terminals.

BRIEF DESCRIPTION OF THE DRAWINGS

The accompanying drawings are incorporated in and constitute a part of this specification and, together with the description, explain the advantages and principles of the invention.

DETAILED DESCRIPTION

Figure 1:
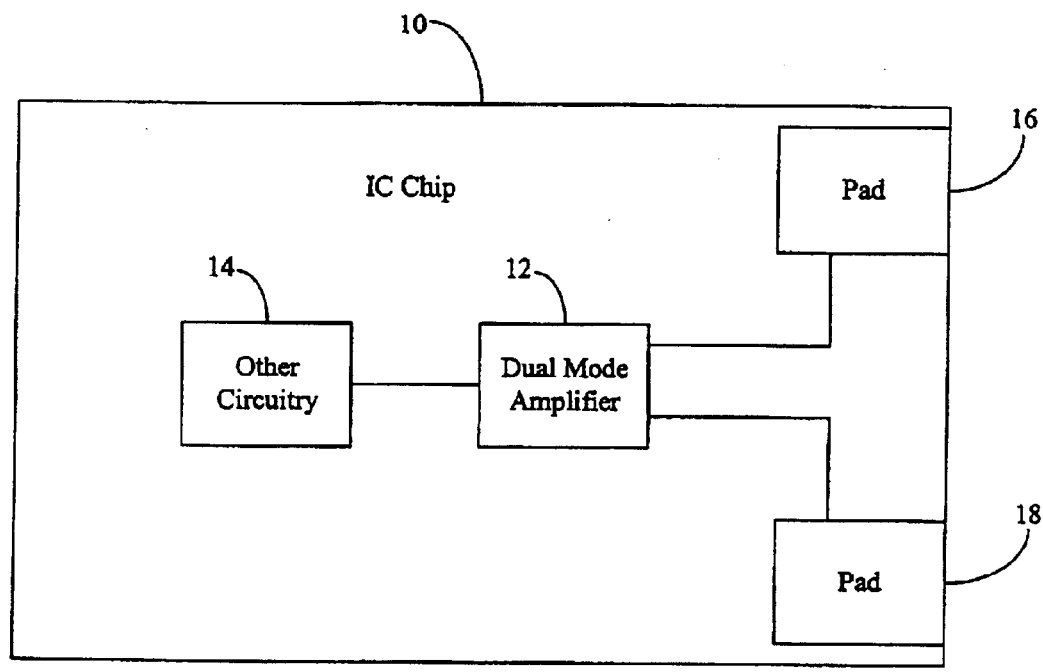
FIG. 1 is a diagram illustrating an integrated circuit chip containing a dual mode amplifier.

FIG. 1 is a diagram illustrating an IC chip 10 containing a dual mode amplifier 12. IC chip 10 includes circuitry 14 that uses dual mode amplifier 12 to drive signals off chip via pads 16 and 18. Many IC chips use dual mode amplifiers and, therefore, an implementation of circuitry 14 will depend upon the type of IC chip in which it is contained. The configuration of dual mode amplifier 12, as explained below, requires only two pads 16 and 18 for providing the output signals in both modes, obviating the need for different pads for each mode. The term pad includes any type of terminal or connection for providing a signal off chip.

Dual mode amplifier 12 operates in two modes. In a first mode, it provides two single ended signals at pads 16 and 18 operating independently of one another. In a second mode, it provides differential output signals at pads 16 and 18. Thus, the first mode is referred to as a singled ended mode, and the second mode is referred to as a differential mode. The terms singled ended mode and differential mode are used only as labels, and the same or equivalent modes can be referred to by other terminology.

Figure 2:
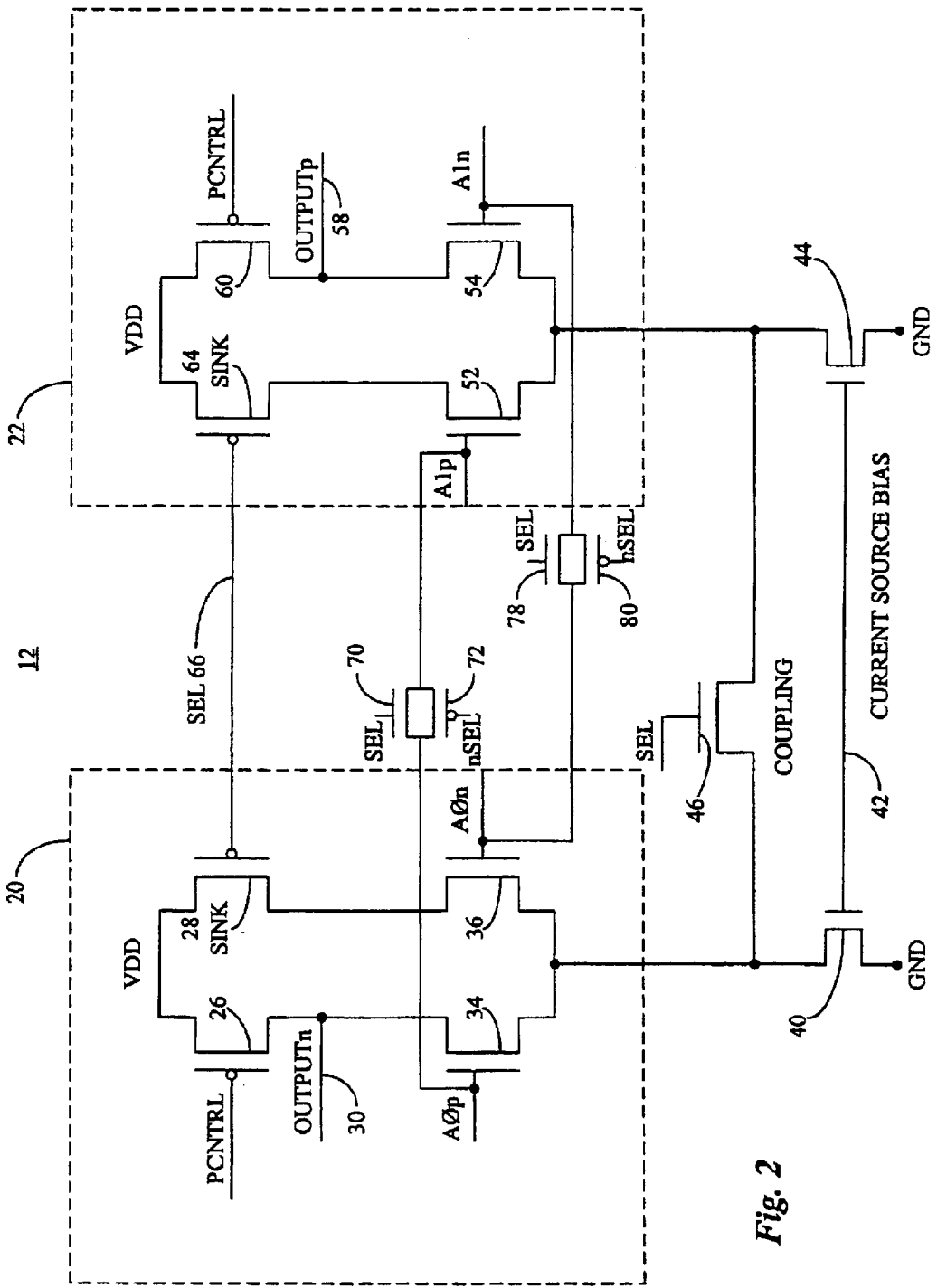
FIG. 2 is a circuit diagram of a dual mode amplifier.

FIG. 2 is a circuit diagram of one embodiment of dual mode amplifier 12. Amplifier 12 includes two differential amplifiers 20 and 22. Amplifier 20 includes transistors 26 and 34 connected in series, transistors 28 and 36 connected in series, and the series pairs connected in parallel. Amplifier 22 includes transistors 54 and 60 connected in series, transistors 52 and 64 connected in series, and the series pairs connected in parallel. In differential amplifier 20, transistors 26 and 34 drive an output signal (OUTPUTn) on line 30, and in differential amplifier 22, transistors 54 and 60 drive an output signal (OUTPUTp) on line 58. Lines 30 and 58 are connected to pads 16 and 18, providing terminals or connections for driving signals off chip.

The gate terminals of the sink transistors 28 and 64 are connected via a line 66. A coupling transistor 46 connects differential amplifiers 20 and 22. Transistors 40 and 44, the gates of which are connected via line 42, provide for current source biasing for differential amplifiers 20 and 22, respectively.

Amplifier 12 may optionally include coupling transistors to reduce distortion in the output signals. These include transistors 70 and 72 connected in parallel and coupling the gate terminals of transistors 34 and 52, and transistors 78 and 80 connected in parallel and coupling the gate terminals of transistors 36 and 54. In the embodiment shown in FIG. 2, coupling transistors 70, 72, 78, and 80 are not absolutely necessary. However, they can reduce distortion in the output signals of amplifier 12, as explained below, and thus enhance its performance.

The inputs to amplifier 12 include two sets or pairs of differential signals, one pair includes signals A0$p$ and A0$n$, and the other pair includes signals A1$p$ and A1$n$. As shown, those inputs are provided at the gate terminals of transistors 34, 36, 52, and 54, respectively. The dual modes of operation are controlled by a control signal, in this example the select signal (SEL). The particular mode of operation, single ended or differential ended, is controlled by first and second values of the select signal SEL, in this example a first value equal to ground (GND) and a second value equal to the power supply value (VDD). Alternatively, other values may be used, and the value for the power supply VDD may depend upon a particular implementation.

In the single ended mode of operation, the select signal SEL is set to ground, and the nSEL signal is set to the power supply value VDD. In this single ended mode, each differential amplifier 20 and 22 operates independently, converting the two differential pair input signals into two singled ended output signals. In particular, differential amplifier 20 converts differential pair input signals A0p and A0n to a single ended output signal (OUTPUTn) on line 30, and differential amplifier 22 converts differential pair input signals A1p and A1n to a single ended output signal (OUTPUTp) on line 58. In this mode, signals OUTPUTn and OUTPUTp operate independently of one another.

In the single ended mode, the sink transistors 28 and 64 are active due to the inverted ground signal (inverted SEL=GND) input to their gate terminals. The coupling transistor 46 is deactivated in the singled ended mode, due to the ground signal (SEL=GND) at its gate terminal, de-coupling differential amplifiers 20 and 22. The optional coupling transistors 70, 72, 78, and 80 are also deactivated due to the ground signals (SEL=GND and inverted nSEL=VDD) input to their gate terminals, deactivating the bias distortion circuitry, when used, for the singled ended mode so that each differential amplifier 20 and 22 can operate independently.

The term activate or active means that the corresponding transistor or other circuit element is on and capable of transmitting current. The term deactivate or deactive means that the corresponding transistor or other circuit element is off and not capable of transmitting current, aside from any negligible current due to leakage or other factors.

In the differential mode of operation, the two pairs of differential input signals, first pair A0p and A0n, and second pair A1p and A1n, are identical from their sources. In this differential mode, the select signal SEL is set to the power supply value VDD, and the nSEL signal is set to ground. The sink transistors 28 and 64 are deactivated due to the ground signal (inverted SEL=VDD) input to their gate terminals. The coupling transistor 46 is active in the differential mode due to the power supply signal (SEL=VDD) input to its gate terminal. With coupling transistor 46 being active, differential amplifiers 20 and 22 operate together (not independently) in order to provide a differential signal at lines 30 and 58 as signals OUTPUTn and OUTPUTp in response to the differential input signals.

Optional coupling circuits can help reduce distortion in the output signals for the differential mode of operation. In particular, the coupling circuits can include, for example, the optional coupling transistors 70, 72, 78, and 80, which are active in the differential mode due to the power supply signal (SEL=VDD and inverted nSEL=GND) input to their gate terminals. Being active, transistors 70 and 72 effectively provide a short between the gate terminals of transistors 34 and 52, eliminating or at least substantially reducing timing differences in the input signals A0p and A1p resulting from distortion or other factors. Likewise, transistors 78 and 80, being active, effectively provide a short between the gate terminals of transistors 36 and 54, eliminating or at least substantially reducing timing differences in the input signals A0n and A1n resulting from distortion or other factors. Therefore, these optional coupling transistors 70, 72, 78, and 80, when used, can reduce distortion in the differential mode by coupling and hence time synchronizing corresponding differential input signals.

Figure 3:
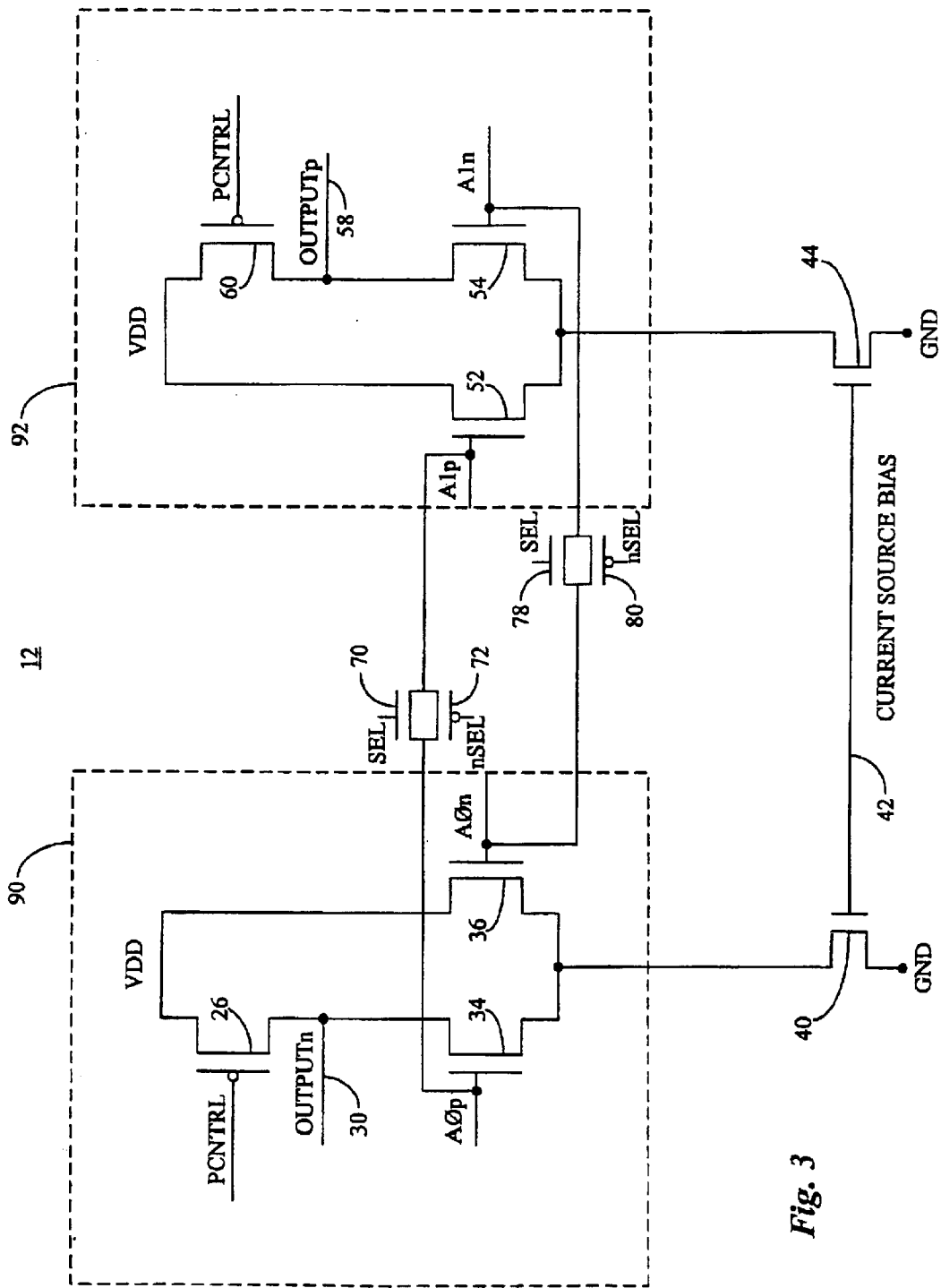
FIG. 3 is a circuit diagram of an alternate embodiment of a dual mode amplifier.

FIG. 3 is a circuit diagram of an alternate embodiment of dual mode amplifier 12. The embodiment in FIG. 3 includes two differential amplifiers 90 and 92, similar to differential amplifiers 20 and 22, except that they do not include sink transistors 28 and 64, and also are not linked by coupling transistor 46. Also, the embodiment in FIG. 3 requires the coupling transistors 70, 72, 78, and 80, or equivalent circuitry.

In the alternate embodiment, transistors 40 and 44, having their gate terminals connected via line 42, provide current source biasing for differential amplifiers 90 and 92. As in the other embodiment, transistors 26 and 34 drive an output signal (OUTPUTn) on line 30 in differential amplifier 90, and transistors 54 and 60 drive an output signal (OUTPUTp) on line 58 in differential amplifier 92. The inputs to amplifier 12 in the alternate embodiment include the two sets of differential signals, first pair A0p and A0n, and second pair A1p and A1n; those inputs are provided at the gate terminals of transistors 34, 36, 52, and 54, respectively.

In the single ended mode of operation in the alternate embodiment, the select signal SEL is set to ground, and the nSEL signal is set to the power supply value VDD. As in the other embodiment, in this single ended mode, each differential amplifier 90 and 92 operates independently, converting the two differential pair input signals into two singled ended output signals. In particular, differential amplifier 90 converts differential pair input signals A0p and A0n to a single ended output signal (OUTPUTn) on line 30, and differential amplifier 92 converts differential pair input signals A1p and A1n to a single ended output signal (OUTPUTp) on line 58. In this mode, signals OUTPUTn and OUTPUTp operate independently of one another. Also, the coupling circuits, implemented with coupling transistors 70, 72, 78, and 80 in this example, are deactivated in this mode due to the ground signal (SEL=GND and inverted nSEL=VDD) input to their gate terminals, decoupling differential amplifiers 90 and 92 so they can operate independently in the single ended mode.

In the differential mode of operation in the alternate embodiment, the two pairs of differential input signals, first pair A0p and A0n, and second pair A1p and A1n, are identical from their sources. In this differential mode, the select signal SEL is set to the power supply value VDD, and the nSEL signal is set to ground. The coupling circuits, implemented with coupling transistors 70, 72, 78, and 80 in this example, are active in the differential mode due to the power supply signal (SEL=VDD and inverted nSEL=GND) input to their gate terminals. Being active, transistors 70 and 72 effectively provide a short between the gate terminals of transistors 34 and 52, eliminating or at least substantially reducing timing differences in the input signals A0p and A1p. Likewise, transistors 78 and 80 effectively provide a short between the gate terminals of transistors 36 and 54, eliminating or at least substantially reducing timing differences in the input signals A1p and A1n. Therefore, these coupling transistors 70, 72, 78, and 80, in the alternate embodiment, couple each pair of differential input signals to provide differential output signals at lines 30 and 58 as signals OUTPUTn and OUTPUTp.

In both embodiments shown in FIGS. 2 and 3, a power control signal (PCNTRL) input to the gate terminals of transistors 26 and 60 is used to toggle off and on a load PFET (26 and 66) or other circuit element, typically on when amplifier 12 is in a voltage mode and off when amplifier 12 is in a current mode. In the voltage mode, the differential amplifiers 20 and 22 (or 90 and 92) provide single or differential ended voltages at lines 30 and 58 for the output signals. In the voltage mode, the differential amplifiers 20 and 22 (or 90 and 92) provide single or differential ended currents at lines 30 and 58 for the output signals.

Although amplifier 12 in both embodiments is shown as implemented using field effect transistors (FETs), it can alternatively be implemented with other types of transistors or circuit elements providing the same or equivalent functions.

In addition, the embodiments shown in FIGS. 2 and 3, or equivalent embodiments, can be used to implement a method for providing dual modes of operation in an amplifier using only one set of output terminals. The method can include the steps of, for example, receiving first and second pairs of differential input signals, the first pair A0p and A0n, and the second pair A1p and A1n, and using a control signal to provide the dual modes of operation. In particular, the using step can include, for example, providing, based upon a first value of the control signal SEL, a differential signal at first and second output terminals at lines 30 and 58 in response to the first and second pair of differential input signals, and providing, based upon a second value of the control signal SEL, single ended signals at the first and second output terminals at lines 30 and 58 in response to the first and second pair of differential input signals, respectively.

Figure 4:
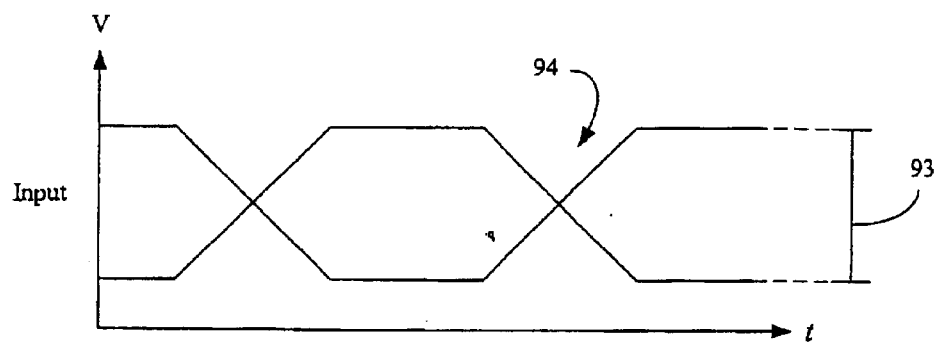
FIG. 4 is a diagram of an exemplary input signal to a dual mode amplifier.
Figure 5:
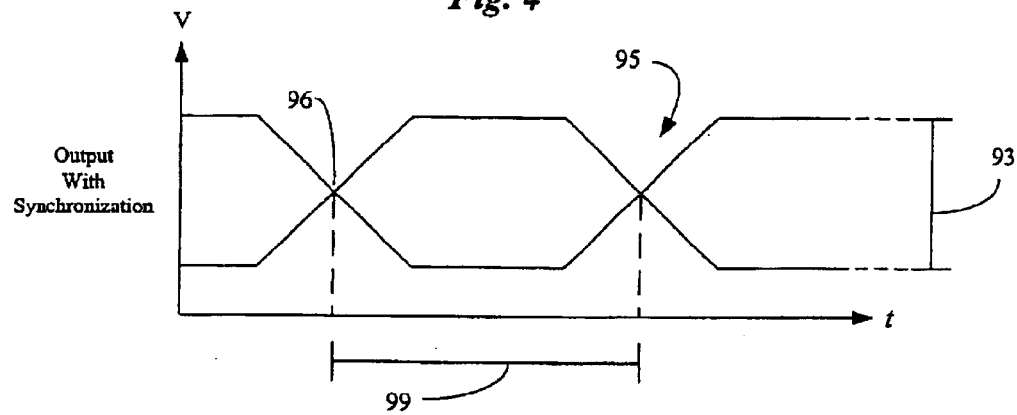
FIG. 5 is a diagram of an exemplary output signal to a dual mode amplifier with synchronization.

FIG. 4 is a diagram of an exemplary input signal 94 to dual mode amplifier 12. FIG. 5 is a diagram of an exemplary output signal 95, based upon input signal 94, of dual mode amplifier 12 with synchronization using coupling transistors 70, 72, 78, and 80 in the embodiment of FIG. 2. With the coupling transistors used to reduce distortion, the differential signals cross at a point 96 at approximately 50% of the difference in amplitude (93) between the signals. For example, with a 400 millivolt (mV) amplitude difference (93), the cross-over point 96 will be at approximately 200 mV between the signals.

Figure 6:
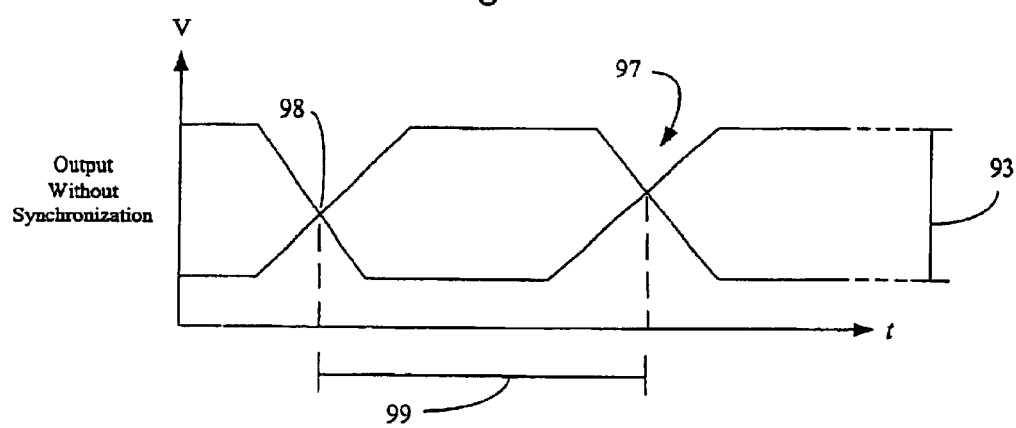
FIG. 6 is a diagram of an exemplary output signal to a dual mode amplifier without synchronization.

FIG. 6 is a diagram of an exemplary output signal 97 to dual mode amplifier 12 without synchronization, meaning without using coupling transistors 70, 72, 78, and 80 in the embodiment of FIG. 2. Without the synchronization provided by these coupling transistors, the differential signals may cross over at a point (98) substantially not equal to approximately 50% of the difference in amplitude between the signals and at variable points away from the 50% value. This variable cross-over point may result from, for example, noise within the circuit. Therefore, although the coupling transistors are not necessary, they can provide for reduced noise and more consistent differential output signals by time synchronizing the input signals.

The time between pulses, pulse width 99, can vary based upon a particular implementation and requirements for the output signals. For example, a high performance output may have a pulse width of 625 picoseconds (ps)±8 ps, while a low performance output may have a pulse width of 800 ps±20 ps. A low performance output may be used with, for example, a memory IC chip, and a high performance output may be use with, for example, an application specific integrated circuit. These exemplary pulse widths, heights, and applications are provided for illustrative purposes only; dual mode amplifier 12 can provide outputs having any particular pulse widths and heights, used for any application.

While the present invention has been described in connection with an exemplary embodiment, it will be understood that many modifications will be readily apparent to those skilled in the art, and this application is intended to cover any adaptations or variations thereof. For example, various types of circuit components and configurations may be used without departing from the scope of the invention. This invention should be limited only by the claims and equivalents thereof.

What is claimed is:

1. An amplifier having dual modes of operation, comprising:
   a first differential amplifier receiving a first pair of differential input signals and having a first output terminal;
   a second differential amplifier receiving a second pair of differential input signals and having a second output terminal;
   a first coupling circuit for coupling first corresponding ones of the first and second pairs of differential input signals; and
   a second coupling circuit for coupling second corresponding ones of the first and second pairs of differential input signals,
   wherein the first and second coupling circuits are controlled by a control signal, wherein a first value of the control signal activates the first and second coupling circuits so that the first and second differential amplifiers provide a differential signal at the first and second output terminals in response to the first and second pairs of differential input signals, and wherein a second value of the control signal deactivates the first and second coupling circuits so that the first and second differential amplifiers operate independently to provide single ended signals at the first and second output terminals in response to the first and second pairs of differential input signals, respectively.

2. The amplifier of claim 1 wherein the first differential amplifier includes:
   a first pair of transistors connected in series; and
   a second pair of transistors connected in series,
   wherein the first pair of transistors is connected in parallel with the second pair of transistors.

3. The amplifier of claim 2 wherein the second differential amplifier includes:
   a third pair of transistors connected in series; and
   a fourth pair of transistors connected in series,
   wherein the third pair of transistors is connected in parallel with the fourth pair of transistors.

4. The amplifier of claim 1 wherein the first and second coupling circuits each include a pair of transistors connected in parallel, wherein the control signal activates and deactivates the pair of transistors.

5. The amplifier of claim 1 wherein:
   the first differential amplifier includes a first pair of transistors connected in series for driving a first signal at the first output terminal; and
   the second differential amplifier includes a second pair of transistors connected in series for driving a second signal at the second output terminal.

6. The amplifier of claim 1 wherein the first and second differential amplifiers each include a circuit element controlled by a power control signal for selectively operating the amplifier in a voltage mode and a current mode.

7. The amplifier of claim 1 wherein:
   the first differential amplifier includes a first pair of transistors for receiving the first pair of differential input signals; and
   the second differential amplifier includes a second pair of transistors for receiving the second pair of differential input signals.

8. The amplifier of claim 1 further including first and second transistors connected in parallel, the first transistor connected with the first differential amplifier and the second transistor connected with the second differential amplifier, wherein the first and second transistors provide current source biasing for the first and second differential amplifiers, respectively.

9. A method for providing dual modes of operation in an amplifier using only one set of output terminals, comprising:

receiving a first pair of differential input signals;

receiving a second pair of differential input signals; and using a control signal to activate a first and second coupling circuits for coupling first and second corresponding ones, respectively, of the first and second pairs of differential input signals, the using step including:

activating the first and second coupling circuits, in response to a first value of the control signal, to provide a differential signal at first and second output terminals in response to the first and second pairs of differential input signals; and deactivating the first and second coupling circuits, in response to a second value of the control signal, to provide single ended signals at the first and second output terminals in response to the first and second pairs of differential input signals, respectively.

10. The method of claim 9 wherein:

the receiving the first pair step includes using a first differential amplifier to receive the first pair of differential input signals; and the receiving the second pair step includes using a second differential amplifier to receive the second pair of differential input signals.

11. The method of claim 9 wherein:

the activating step includes activating first and second pairs of transistors connected in parallel; and the deactivating step includes deactivating the first and second pairs of transistors.

12. The method of claim 9, further including selectively operating the amplifier in a voltage mode and a current mode.

13. The method of claim 10, further including providing current source biasing to the first and second differential amplifiers.

* * * * *